(12) United States Patent
Ina et al.

(10) Patent No.: US 6,770,408 B2
(45) Date of Patent: Aug. 3, 2004

(54) DUST PARTICLE INSPECTION METHOD FOR X-RAY MASK

(75) Inventors: Hideki Ina, Yokohama (JP); Kenji Itoga, Chiyoda-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 132 days.

(21) Appl. No.: 10/223,301

(22) Filed: Aug. 20, 2002

(65) Prior Publication Data

US 2002/0197545 A1 Dec. 26, 2002

Related U.S. Application Data

(62) Division of application No. 09/689,861, filed on Oct. 13, 2000, now abandoned.

(30) Foreign Application Priority Data

Oct. 15, 1999 (JP) .......................................... 11-293569

(51) Int. Cl.⁷ ................................................ G03F 9/00
(52) U.S. Cl. ............................. 430/30; 430/5; 430/966; 430/967; 378/34; 378/35; 382/144
(58) Field of Search ............................. 430/5, 30, 966, 430/967; 378/34, 35; 382/144

(56) References Cited

U.S. PATENT DOCUMENTS

| 5,399,867 | A | * | 3/1995 | Kohno ..................... 250/461.1 |
| 5,790,247 | A | * | 8/1998 | Henley et al. .............. 356/237 |
| 6,317,480 | B1 | | 11/2001 | Shoki et al. ................... 430/5 |

FOREIGN PATENT DOCUMENTS

JP    1-181908    7/1989

* cited by examiner

*Primary Examiner*—Christopher G. Young
(74) *Attorney, Agent, or Firm*—Fitzpatrick, Cella, Harper & Scinto

(57) ABSTRACT

Disclosed is an X-ray mask for use in an exposure apparatus for transferring a circuit pattern onto an exposure substrate by use of an X-ray beam to produce a semiconductor device, wherein the X-ray mask includes an X-ray transmission film having a layered X-ray absorptive material formed thereon, and a holding frame for holding the X-ray transmission film, and wherein the X-ray transmission film is held by the holding frame with an even step-like structure defined at its peripheral portion. With this arrangement, a dust particle adhered to the X-ray mask surface and having a predetermined height can be detected precisely, such that a large integration device can be produced effectively.

2 Claims, 13 Drawing Sheets

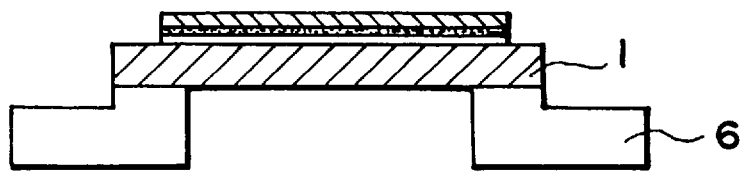
F I G. 18
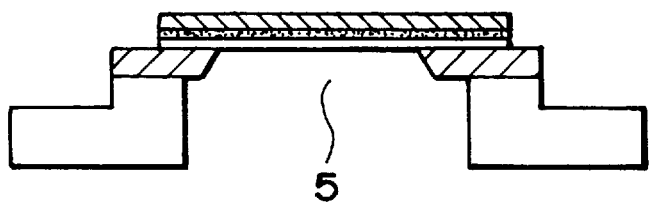
F I G. 19
F I G. 20
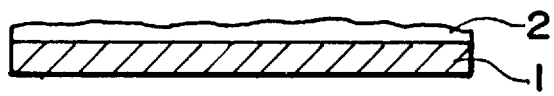
F I G. 21
F I G. 22
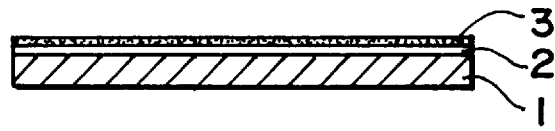
F I G. 23
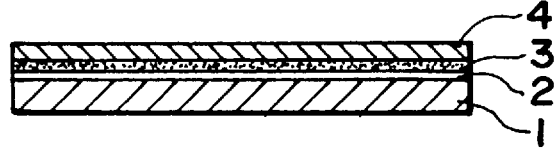
F I G. 24

F I G. 25
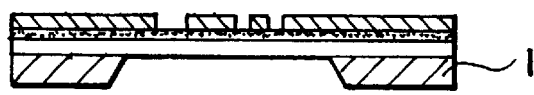
F I G. 26
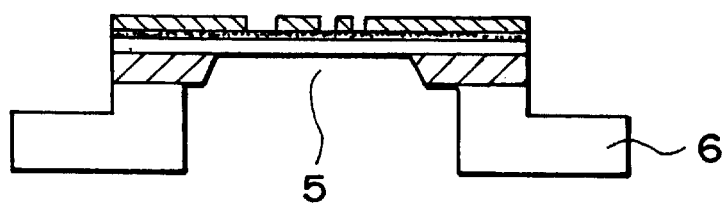
F I G. 27
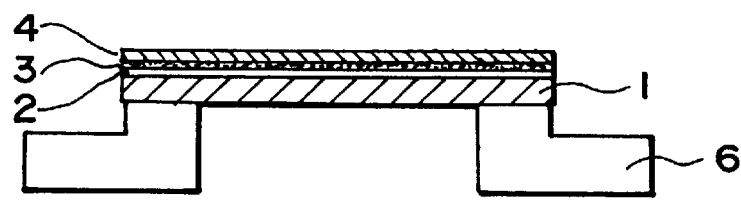
F I G. 28
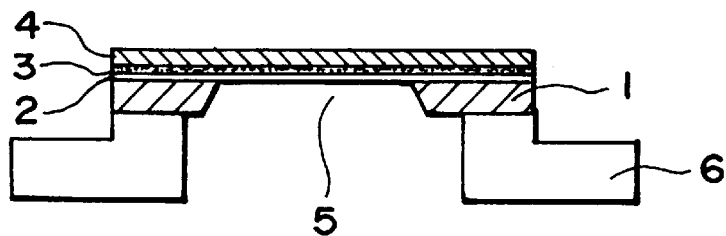
F I G. 29

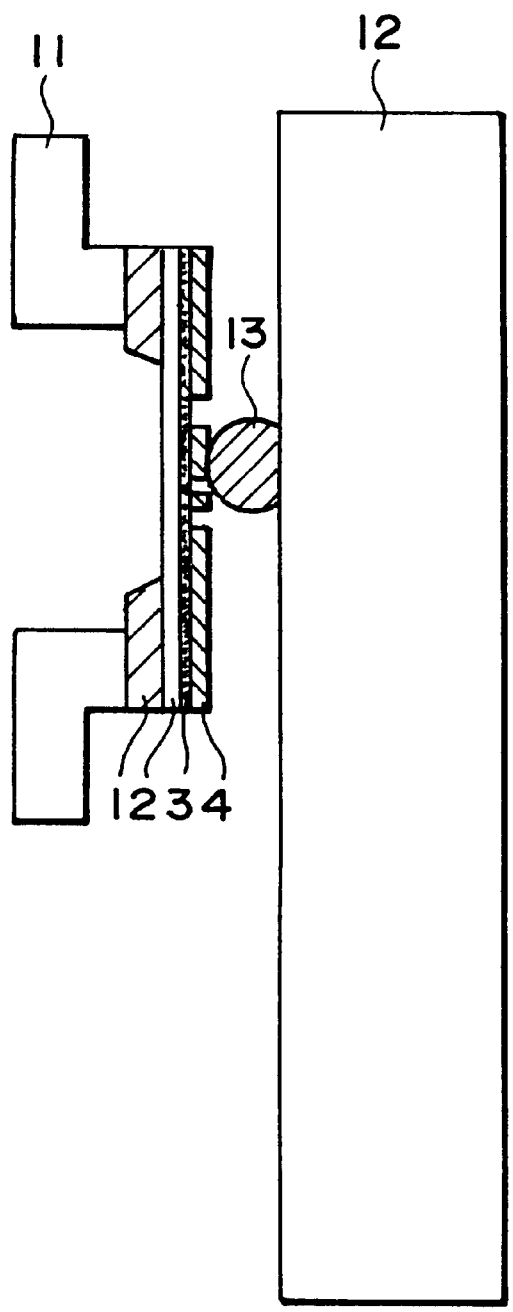
F I G. 34

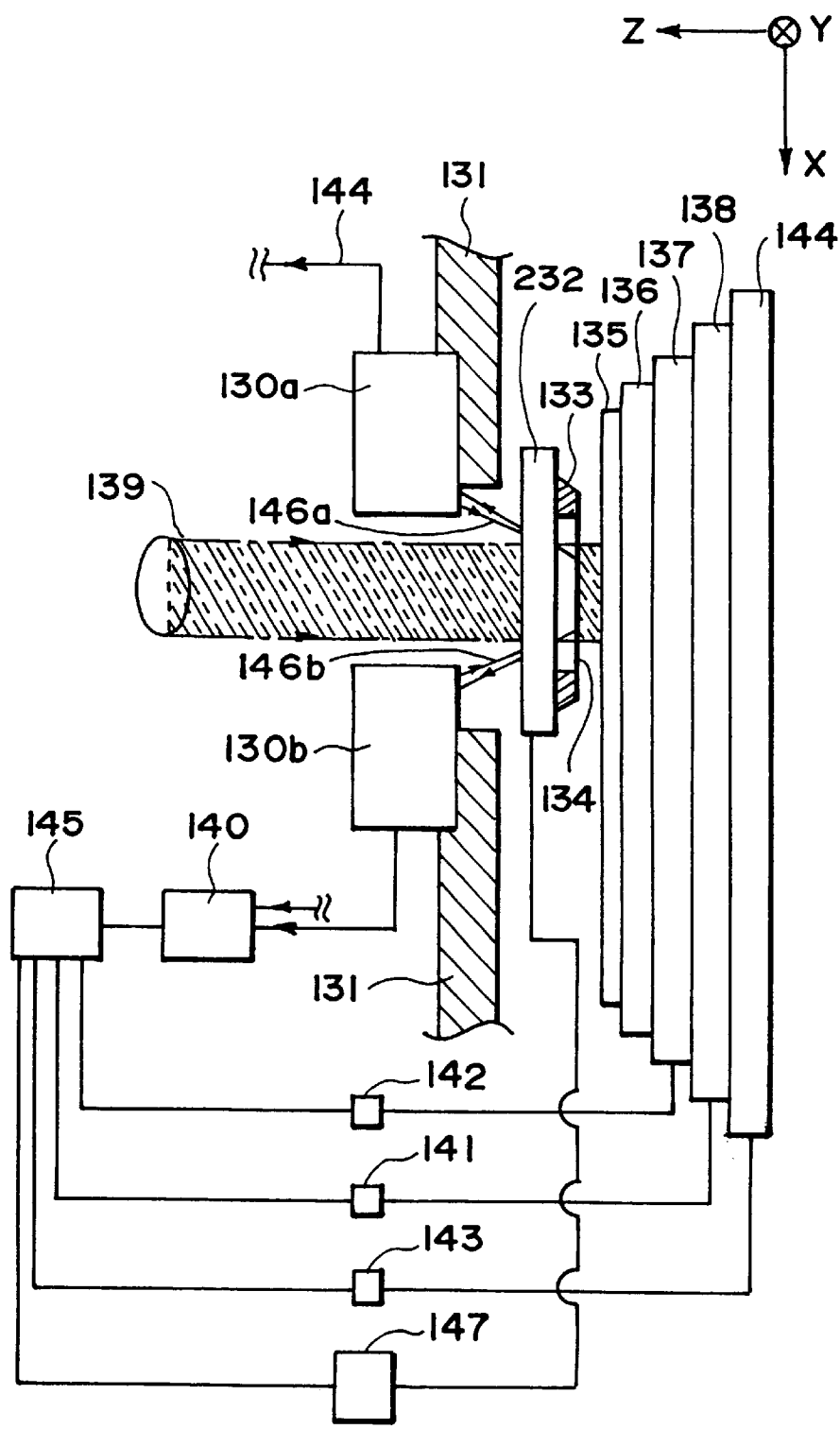
F I G. 38

DUST PARTICLE INSPECTION METHOD FOR X-RAY MASK

This application is a division of application Ser. No. 09/689,861, filed Oct. 13, 2000 now abandoned.

FIELD OF THE INVENTION AND RELATED ART

This invention relates to an X-ray mask and a device manufacturing method using the same. The present invention is suitably usable for inspection of the state of presence/absence a foreign substance such as a dust particle (presence/absence of or the size of such particle), upon a substrate such as a mask, for example, having a circuit pattern formed thereon, particularly in the field of the manufacture of devices such as semiconductor devices (e.g., IC or LSI), CCDs, liquid crystal panels or magnetic heads, for example. Thus, the present invention is suitably applicable to the manufacture of high-precision devices such as described above.

Particularly, the present invention provides specific advantageous effects when the same is applied to a semiconductor exposure method called a "Proximity X-ray Lithography" (hereinafter, "PXL") wherein an X-ray beam of a wavelength 7–10 angstroms emitted from an electron accumulation ring (synchrotron radiation unit) is used as a light source and wherein a pattern of a mask is transferred to a wafer at a unit magnification while the mask and the wafer are disposed opposed to each other with a gap of a few tens microns maintained therebetween.

Generally, in IC manufacturing processes, a circuit pattern formed on a substrate such as a mask is transferred to a wafer, being coated with a resist, by use of an exposure apparatus. If in this procedure there is a foreign substance such as a dust particle upon the surface of the substrate, such particle is also transferred in the transfer process to decrease the yield of the IC or LSI production.

In the conventional PXL procedure, a mask is disposed opposed to a wafer with a gap (clearance) of 10–30 microns kept therebetween, and the mask pattern is transferred to the wafer through Fresnel diffraction.

As regards exposure apparatuses of PXL type, an exposure apparatus having a largest exposure range of 52 mm square has currently been proposed. The largest exposure range of 52 mm square means that, even in the unit-magnification exposure, for a wafer of a size of 4 inches or larger, the whole surface of the wafer can not be exposed through a single exposure operation.

In the PXL exposure process, the whole surface of a wafer is exposed while the wafer is moved sequentially as in a repetition reduction exposure apparatus, called a "stepper". Thus, in this respect, an exposure apparatus of PXL type may be called as a "unit magnification X-ray stepper".

As regards the resolution, a result of 100 nm or less, or a result of 20 nm or less based on the alignment result, has been reported. Also, it is recognized that the PXL has a potential for an exposure process for devices of 1 gigabit or more.

One special feature of the PXL is an X-ray mask. Conventional X-ray mask manufacturing processes will now be explained, with reference to FIG. 20 and the like. Here, as regards the thicknesses of a mask, a wafer and a film thereon, for better understanding, they are illustrated in proportions different from practical proportions.

In the manufacture of a PXL mask, as shown in FIG. 20, a silicon (Si) wafer 1 is prepared as a substrate. Then, as shown in FIG. 21, a SiC film 2 of a thickness of 2–3 microns, called a membrane, is formed on the Si wafer 1.

When the SiC film 2 is produced on the Si wafer 1, practically the film is formed on the top and bottom faces of the substrate as well as the side face thereof. Since, however, the bottom face and the side face do not provide a function, in FIG. 21 and later, the films formed there are not illustrated.

Subsequently, as shown in FIG. 22, the surface of the SiC film 2 is flattened by polishing, whereby a SiC film 23 is provided. Then, an ITO film or $SiO_2$ film 3 is produced as an etching stopper and also for better affinity with an X-ray absorptive layer. Thereafter, as shown in FIG. 9, a material having a relatively high X-ray absorptivity such as W, Ta or $Ta_4B$, for example, is applied with a thickness 0.3–0.5 micron, as an X-ray absorptive material 4. Then, as shown in FIG. 25, through various processes such as resist application, desired patterning with an electron beam patterning apparatus, development, etching, and resist separation, a pattern is defined by the X-ray absorbing material 4.

Subsequently, as shown in FIG. 26, a portion of the Si wafer 1 at a side thereof remote from the pattern is removed by back etching, such that X-rays can transmit through the Si wafer portion 5 corresponding to the exposure range. Finally, as shown in FIG. 27, the peripheral portion of the Si wafer 1 is mounted on a frame 6, by which an X-ray mask is accomplished.

It is well known that, in order to minimize the patterning error, an additional procedure may be performed after the step of FIG. 25, so that, as shown in FIG. 28, the Si wafer 1 is mounted on a frame 6 and then, as shown in FIG. 29, the portion of the Si wafer 1 corresponding to the exposure range is back etched to enable transmission of X-rays therethrough. Thereafter, as shown in FIG. 29 and like FIG. 27, various processes such as resist application, desired patterning with an electron beam patterning apparatus, development, etching, and resist separation may be performed so that a pattern is defined by the X-ray absorbing material 4.

However, if the patterning process is performed after the frame 6 is mounted to the Si wafer 1, there may arise a problem that the Si wafer 1 and the frame 6 are detached from each other due to heat. In consideration of it, in many cases, the X-ray mask is produced by taking processes such as shown in FIGS. 20–27.

As regards the frame, it may be called as a "support ring". As for the material thereof, Pyrex or SiC is used. For mounting it to the membrane, an anodic bonding process or an adhesive agent is used.

A proposal has been made to use an integral type frame 33 (FIG. 35) wherein the frame 6 of FIG. 35 is made of the same material as the Si wafer 1, that is, to make the Si wafer substrate 1 and the frame 6 as a unit.

There is a problem peculiar to the PXL. That is, when a dust particle of a size larger than the exposure gap between a mask and a wafer is sandwiched between the mask (particularly, a SiC membrane) and the wafer, the SiC portion of the mask may be destroyed.

Seemingly, if the exposure gap is 10 microns, there is no possibility that a dust particle larger than 10 microns is present between a wafer and a mask. This is particularly so because a good yield rate is regarded absolutely important in the semiconductor manufacture. However, this is not correct. Particularly, if a dust particle is attached to a peripheral portion outside the effective area of a wafer or mask, a problem peculiar to the PXL arises.

As regards such dust particle adhered to the peripheral portion of a mask or wafer, it has not raised a critical problem since the current semiconductor manufacturing procedure uses, in most cases, an exposure apparatus called "optical exposure apparatus" wherein a pattern of a mask is projected and printed on a wafer through a projection optical system. In such optical exposure apparatus, there is a distance of 1 cm or more between the wafer and the projection optical system of the exposure apparatus. Further, the peripheral portion of a wafer is not used for the IC production. Therefore, as regards a dust particle at the wafer peripheral portion, no inspection process is currently performed.

However, according to the observation of the wafer peripheral portion made by the inventors of the subject application, in many cases there were large dust particles at the wafer peripheral portion. It has been found that, even in the semiconductor manufacture wherein a good yield rate is regarded absolutely important, in many cases there are large dust particles at the wafer peripheral portion.

As long as optical exposure apparatuses are used, no critical problem may arise from a dust particle at the wafer peripheral portion. However, the problem is just not yet known. To be exact, there is a possibility that such dust particle is displaced (separated) from the wafer peripheral portion, for some reason, to a wafer pattern portion (effective area) to cause a critical problem. A wafer inspection apparatus for inspecting any dust particle on a wafer having a pattern already formed thereon, may be used to perform the inspection, to prevent a decrease of the yield.

However, in the PXL procedure, the presence of a dust particle at the peripheral portion can cause a serious problem.

It is now assumed that, as shown in FIG. 31, a dust particle 13 is adhered to a peripheral portion of a wafer 12, and that a PXL exposure process is performed with a predetermined gap kept between the wafer and a mask 11. When the wafer 12 is thereafter moved such as shown in FIG. 32 for exposure of a region near the peripheral portion of the wafer 12, a force is applied to the dust particle 13 attached to the wafer 12.

At this time, since the dust particle 13 contacts to a portion of the Si material 1 of the mask 11, not having been back etched, this does not cause breakage of the mask 11.

However, if after the exposure the wafer 12 moves for exposure of another region thereof, since a force has been applied to the dust particle 13, the motion of the wafer 12 causes separation of the dust particle 13 from the wafer 12. Thus, the dust particle 13 also moves to another place.

As the dust particle 13 moves, it may be attached to a region corresponding to the SiC portion 2 of the pattern 5 of the mask 11, having been back etched, as shown in FIG. 33. In that occasion, when the exposure and wafer motion process is repeated, a force is applied again to the dust particle 13. Since the SiC portion 2 there has a thickness of 2–3 microns, the SiC portion may be destroyed.

Although what described above concerns an example wherein a dust particle is adhered to a peripheral portion of the wafer 12, the same applies to a case where a dust particle is attached to a peripheral portion of the mask 11.

FIG. 34 illustrates it. That is, a dust particle 13 is attached to a mask 1 at a first shot of wafer exposure. A force is applied to the dust particle 13 as the same is sandwiched between the mask and the wafer 12. The mask 11 is not broken thereby because of a similar reason as the case where a dust particle is attached to the peripheral portion of the wafer, as described hereinbefore. As the wafer 12 moves thereafter, the dust particle 13 may be moved and adhered to a region corresponding to the SiC portion 2 where the Si material portion of the mask 11 has been back etched. In that occasion, the mask 11 may be destroyed, similarly.

As described above, a dust particle at a peripheral portion of a mask or wafer, which does not cause serious inconveniences in the optical exposure method, particularly when it is larger than the exposure gap, may cause a critical problem of breakage of a mask.

Further, even if the mask is not broken, if a dust particle being moved displaces onto a wafer and it is not detected by inspection for some other reason, the semiconductor device may not function well. Thus, it may cause a decreased yield rate. This is similar to the problem in the optical exposure method.

The inventors of the subject application have made investigations about dust particle inspection to the whole surface of a wafer and an X-ray mask, including the peripheral portion thereof, by use of a wafer dust particle inspection apparatus for detecting a dust particle on a wafer having a pattern already formed thereon.

As regards the wafer dust particle inspection apparatuses for detecting a dust particle on a wafer having a pattern already formed thereon, there is a type which is based on such detection principle that a polarized light is obliquely projected on a wafer so that, by a circuit pattern, the light is reflected while keeping its polarization characteristic, whereas, by a dust particle, the light is reflected with a non-polarized state.

Inspection apparatuses using this detection principle have already been developed as product machines, and they practically assure a high throughput that the detection time of only 1 minute or shorter is necessary for an 8-inch wafer, as well as a high reliability. They have contributed to higher yield rates.

However, as described above, in optical exposure apparatuses, no concern has been put on the peripheral portion of a wafer.

According to the investigations made by the inventors of the subject application, it has been found that, by using such wafer dust particle inspection apparatus, for both a mask and a wafer, a dust particle can be detected while being distinguished from an etched portion of the Si material at the periphery. However, it has also been found that, in the vicinity of the periphery of the mask, there is a possibility that a signal larger than one for a usual dust particle may be produced to cause an erroneous detection as the presence of a large dust particle.

The cause of such erroneous detection will be such as follows. As regards a mask, currently, no specific design has been made to the structure of the peripheral portion. Therefore, in a CVD apparatus, a dust particle may be adhered to a peripheral portion of a wafer when the same is supported. Also, there may be non-uniformness of SiC film thickness or of absorptive material film thickness, due to influences applied from the peripheral portion of the mask. Further, there may be a peeled film portion produced as the film is scratched by tweezers or the like during the mask handling, for example, when the mask is mounted on a frame.

If these particles or surface irregularities are measured by using a current dust particle inspection apparatus for a wafer having a pattern formed thereon, it may be discriminated that there is a large dust particle, being larger than 10 microns.

In current wafer dust particle inspection apparatuses, the size of a dust particle is discriminated on the basis of a correlation table for a particle and a corresponding signal output detected beforehand. In this detection principle, the dust particle is taken as providing isotropic light scattering. On the other hand, from the peeled film portion or from the film thickness irregularities, because of its complicated structure, the light may be refracted and scattered and, thus, it may be detected. In that occasion, a large output signal as compared with a signal output of isotropic scattering light from a dust particle, is detected consequently. Thus, as regards the peeled film or the like, it may be detected as being a large dust particle, being larger than its real size, such as more than 10 microns.

Further, it has been found that, in the peripheral portion of a wafer, a dust particle may be crushed during the conveyance or as the wafer is mounted on a carrier, such that a dust particle of a large size, although it has no height, may be detected.

However, such peeled film, film non-uniformness, or a flat dust particle on the wafer is not a particle which has a height of 10 microns or more. Thus, it has no potential of causing breakage of the mask.

SUMMARY OF THE INVENTION

It is accordingly an object of the present invention to provide an X-ray mask and a device manufacturing method using the same, by which a dust particle having a potential of causing breakage of a mask and a dust particle not having such potential can be discriminated and inspected, to thereby facilitate the manufacture of large integration devices.

In accordance with an aspect of the present invention, there is provided an X-ray mask for use in an exposure apparatus for transferring a circuit pattern onto an exposure substrate by use of an X-ray beam to produce a semiconductor device, said X-ray mask comprising: an X-ray transmission film having a layered X-ray absorptive material formed thereon; and a holding frame for holding said X-ray transmission film; wherein said X-ray transmission film is held by said holding frame with an even step-like structure defined at its peripheral portion.

In accordance with another aspect of the present invention, there is provided an X-ray mask for use in an exposure apparatus for transferring a circuit pattern onto an exposure substrate by use of an X-ray beam to produce a semiconductor device, said X-ray mask comprising: an X-ray transmission film having a layered X-ray absorptive material formed thereon; and a holding frame for holding said X-ray transmission film; wherein said X-ray transmission film is held by said holding frame, with an even step-like structure defined while leaving a portion of or the whole of a peripheral portion of said holding frame.

In accordance with a further aspect of the present invention, there is provided an X-ray mask for use in an exposure apparatus for transferring a circuit pattern onto an exposure substrate by use of an X-ray beam to produce a semiconductor device, said X-ray mask comprising: an X-ray absorptive material formed into a desired pattern; an X-ray transmission film for supporting said X-ray absorptive material; and a holding frame for holding said X-ray transmission film; wherein a surface-step structure even with said holding frame is defined at a peripheral portion of said X-ray absorptive material and said X-ray transmission film.

A step-like structure even with said holding frame may be defined by removing a portion of a peripheral portion of said X-ray absorptive material and said X-ray transmission film.

The X-ray mask may be adapted to be handled by use of a region at the peripheral portion where the portion of said X-ray absorptive material and said X-ray transmission film has been removed.

In accordance with a yet further aspect of the present invention, there is provided an exposure apparatus for transferring a circuit pattern formed on an X-ray mask as recited above, onto an exposure substrate.

In accordance with a still further aspect of the present invention, there is provided a method of manufacturing a semiconductor device, comprising the steps of: transferring a circuit pattern onto an exposure substrate by use of an exposure apparatus as recited above; and developing, thereafter, the substrate for production of a semiconductor device.

In accordance with a yet further aspect of the present invention, there is provided a semiconductor device as manufactured by use of an exposure apparatus as recited above.

In accordance with another aspect of the present invention, there is provided a dust particle inspection method for use with an X-ray mask as recited above, wherein the X-ray mask includes an X-ray absorptive material and an X-ray transmission film having an even step-like structure defined at a peripheral portion thereof, characterized in that, when the dust particle inspection is made to the X-ray mask, an even signal output is produced from the even step-like structure by which the peripheral portion of the X-ray absorptive material and the X-ray transmission film is detected to enable dust particle control at the peripheral portion.

In accordance with a further aspect of the present invention, there is provided an X-ray mask manufacturing method for producing an X-ray mask to be used in an exposure apparatus for transferring a circuit pattern onto an exposure substrate by use of an X-ray beam for production of a semiconductor device, characterized in that a peripheral portion of an X-ray transmission film held by a holding frame is removed to provide a step-like structure.

The removal of the peripheral portion may be carried out by execution of resist application, exposure, development, etching and resist separation.

In accordance with a yet further aspect of the present invention, there is provided an exposure method for transferring a circuit pattern onto an exposure substrate by use of an X-ray mask as recited above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 8–19 are schematic views, respectively, for explaining processes and examples for producing an X-ray mask having an even step-like structure at a peripheral portion thereof, by using exposure and etching.

FIGS. 20–29 are schematic views, respectively, for explaining processes and examples for producing a conventional X-ray mask.

FIGS. 33 and 34 are schematic views, respectively, for explaining how a mask is broken as a dust particle adhered to a peripheral portion of the mask moves when the mask and the wafer are disposed opposed with a predetermined exposure gap.

FIG. 38 is a schematic view of a main portion of a semiconductor device manufacturing apparatus into which an X-ray mask according to the present invention is incorporated.

DESCRIPTION OF THE PREFERRED EMBODIMENTS

Preferred embodiments of the present invention will now be described with reference to the accompanying drawings.

In the embodiments to be described below, an even step-like structure is so formed that it is to be detected uniformly with an output change smaller than a change in a detection output as can be discriminated as a dust particle in a dust particle inspection machine. More preferably, the step-like structure itself is removed so that the step-like structure has a uniformness in shape to the extent that the change in shape thereof is smaller than a detection resolution of the dust particle inspection machine.

Figure 1:
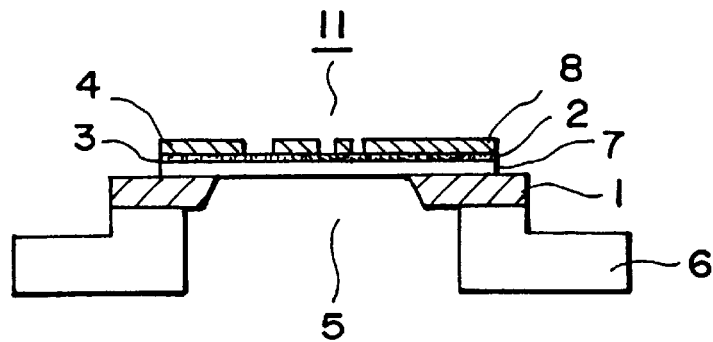
FIG. 1 is a sectional view of an X-ray mask structure according to the present invention.
Figure 2:
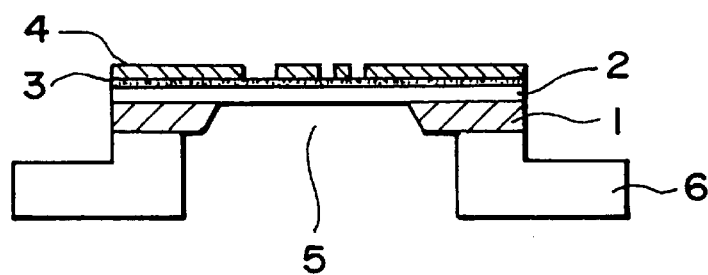
FIG. 2 is a sectional view of an X-ray mask structure of a conventional example.
Figure 3:
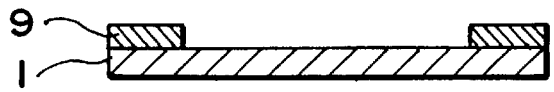
FIGS. 3–6 are schematic views, respectively, for explaining processes for producing an X-ray mask having an even step-like structure at a peripheral portion thereof, by using adhesion type masking.
Figure 4:
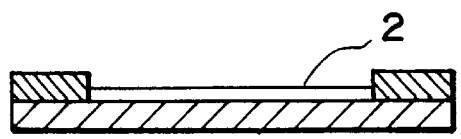
Figure 5:
Figure 6:
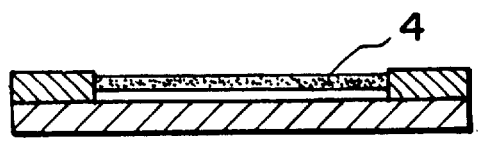

FIG. 1 is a sectional view of a main portion of an X-ray mask according to a first embodiment of the present invention. FIG. 2 is a sectional view of a main portion of a conventional X-ray mask.

In this embodiment, when a mask and a wafer are disposed opposed to each other for the PXL procedure, with an exposure gap (clearance) of about 10 microns kept therebetween, adhesion of a dust particle of about 10 microns between the mask and the wafer is prevented.

To this end, in the X-ray mask structure, an absorptive material, a ITO film or a SiC film at the peripheral portion is removed to provide an even step-like structure. With this arrangement, scratching during the mask handling operation is prevented and non-uniformness in thickness of films is avoided, such it can be distinguished from an adhered dust particle.

In FIG. 1, denoted at 11 is an X-ray mask, and denoted at 1 is a Si wafer (substrate). Denoted at 2 is a SiC film (membrane), and denoted at 3 is a ITO film or $SiO_2$ film. Denoted at 4 is an X-ray absorptive material, and denoted at 5 is an opening. Denoted at 6 is a mask frame (frame), and denoted at 7 is an even step-like structure formed at the peripheral portion of the mask 7.

As regards conventional X-ray masks one of which is illustrated in FIG. 2, no specific structure is arranged at the peripheral portion thereof. During the film formation through a CVD process, a SiC material 2 or an absorptive material 4 is applied to the whole surface. This may cause non-uniformness of the SiC film thickness or of the absorptive material film thickness, at the peripheral portion thereof. Further, there may be a peeled film portion produced as the film is scratched by tweezers or the like during the mask handling, for example. When a currently available dust particle inspection machine, for inspection of a wafer having a pattern, is used, they will be discriminated as a large dust particle.

In consideration of it, in the X-ray mask structure of this embodiment, as shown in FIG. 1, regarding at least a region to be used by the mask handling, the SiC material 2 or the absorptive material 4 is removed by etching, for example, to define a region 7 of the Si substrate to be exclusively used by the mask handling. Erroneous detection as the presence of a large dust particle can be prevented by this.

As shown in FIG. 1, the peripheral portion denoted 8 is formed with a vertical step-like structure. In a wafer dust particle inspection machine, a constant signal output is produced continuously at the peripheral portion. It is therefore necessary to prepare an algorithm for discriminating that the signal represents the vertical step-like structure at the peripheral portion. If the signal shifts from the constant signal output, it means that there is really a dust particle adhered at the vertical step-like structure 7.

As described, this embodiment provides an X-ray mask having an X-ray absorptive material 4 formed into a desired pattern and an X-ray transmission film 2 for supporting the absorptive material 4, wherein the absorptive material 4 and the X-ray transmission film 2 at the peripheral portion are removed to provide an even step-like structure 7, such that, in the dust particle inspection, a uniform signal output is obtainable therefrom. This enables discrimination of the step-like structure on one hand, and handling of the X-ray mask structure by using the region 7 at the peripheral portion where the absorptive material 4 and the X-ray transmission film 2 have been removed, on the other hand.

The processes for manufacturing the X-ray mask structure shown in FIG. 1 will be described with reference to FIGS. 8–14.

Figure 8:
Figure 9:

The processes shown in FIGS. 8–12 are similar to those of the conventional mask manufacturing procedure shown in FIGS. 20–24. Namely, in the manufacture of a PXL mask 11, as shown in FIG. 8, a silicon (Si) wafer 1 is prepared as a substrate. Then, as shown in FIG. 9, a SiC film 2 of a thickness of 2–3 microns, called a membrane, is formed on the Si wafer 1.

When the SiC film 2 is produced on the Si wafer 1, practically the film is formed on the top and bottom faces of the substrate as well as the side face thereof. Since, however, the bottom face and the side face do not provide a function, in FIG. 9 and later, the films formed there are not illustrated.

Figure 10:
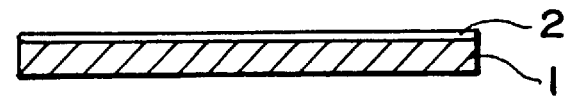
Figure 11:
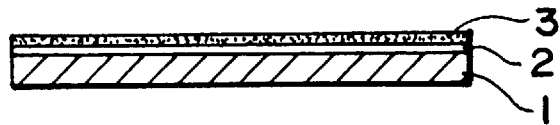
Figure 12:
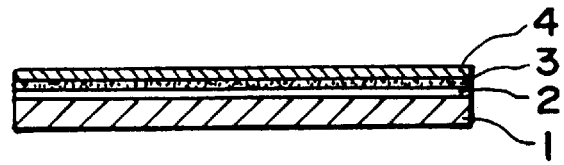

Subsequently, as shown in FIG. 10, the surface of the SiC film is flattened by polishing. Then, as shown in FIG. 11, an ITO film or $SiO_2$ film 3 is produced as an etching stopper and also for better affinity with an X-ray absorptive layer 4. Thereafter, as shown in FIG. 12, a material having a relatively high X-ray absorptivity such as W, Ta or $Ta_4B$, for example, is applied with a thickness 0.3–0.5 micron, as the X-ray absorptive material 4.

Figure 13:

Then, as shown in FIG. 13, a resist is applied to the absorptive material 4, and exposure of only the peripheral portion is carried out. Also, processes of development, etching, and resist separation are performed, whereby the absorptive material 4 only in the peripheral portion is removed. Since, in this exposure process, the whole of the peripheral portion is exposed, a high resolving power is not necessary therefor. Thus, it does not need an electron beam exposure process.

For example, it may be done by means of a unit-magnification optical scanning exposure apparatus using a mask, or on the basis of a mask-less exposure method using a laser. Also, as regards the resist material, one suitable for the exposure method adopted may be used.

Figure 14:

Subsequently, as shown in FIG. 14, while using the absorptive material 4 as a mask, the ITO film 3 and the SiC film 2 are etched to remove only the peripheral portion of them. Here, if using only the absorptive material 4 as a mask causes some inconveniences, the last resist separation in FIG. 13 may not be carried out, such that both the resist and the absorptive material 4 can be used as an etching mask in FIG. 14.

Figure 15:

Thereafter, as shown in FIG. 15, the surface of the X-ray absorptive material 4 is patterned as desired, by using an electron beam exposure method. Here, if the exposure of the peripheral portion has been done by using an electron beam, the resist separation in FIG. 13 or 14 may be omitted so that the resist can be used also in this process.

Where the exposure of the peripheral portion in FIG. 13 is performed by use of i-line light of a wavelength 365 nm, for example, the same resist can not be used for the electron beam exposure. Therefore, the resist separation has to be done in FIG. 13 or 14. Then, resist application should be made again and, thereafter, processes of pattern drawing, development, etching and resist separation should be carried out.

Figure 16:
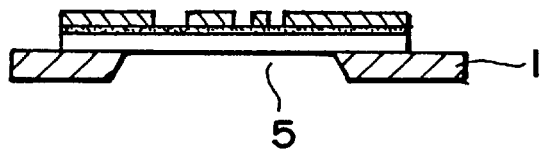
Figure 17:
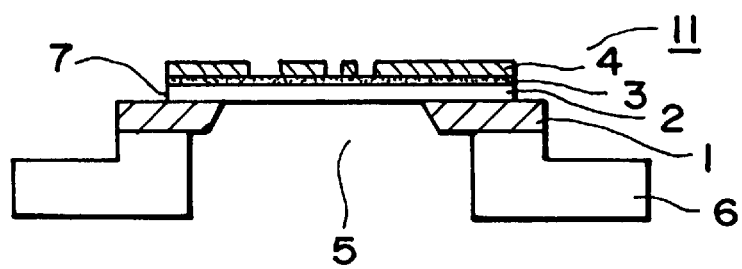
Figure 30:
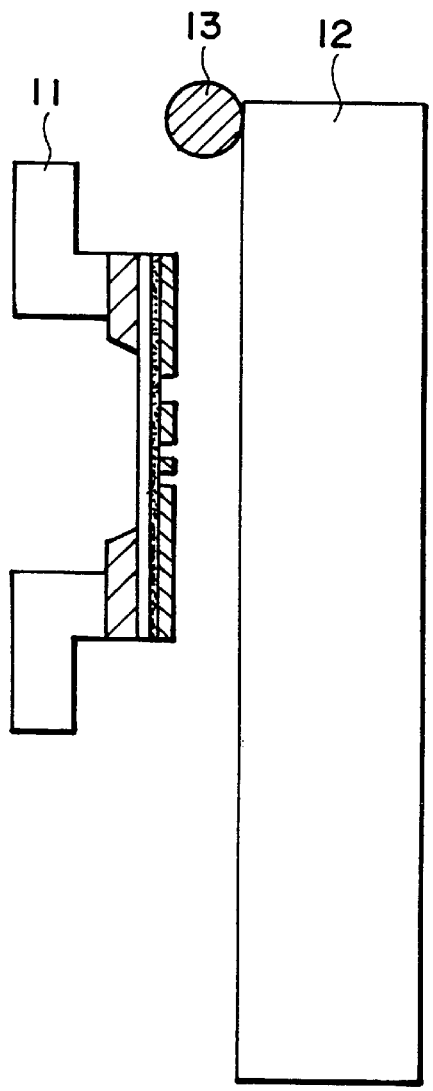
FIGS. 30–32 are schematic views, respectively, for explaining how a mask is broken as a dust particle adhered to a peripheral portion of a wafer moves when the mask and the wafer are disposed opposed with a predetermined exposure gap.
Figure 31:
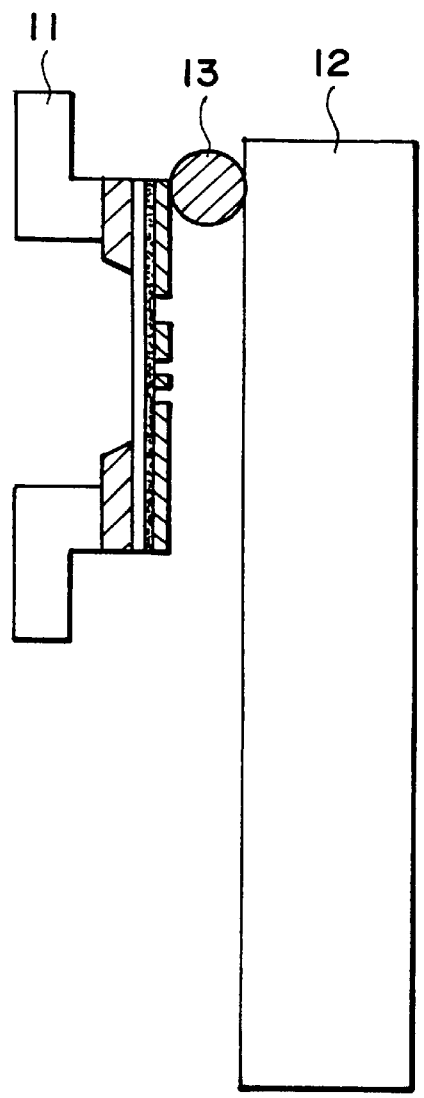
Figure 32:
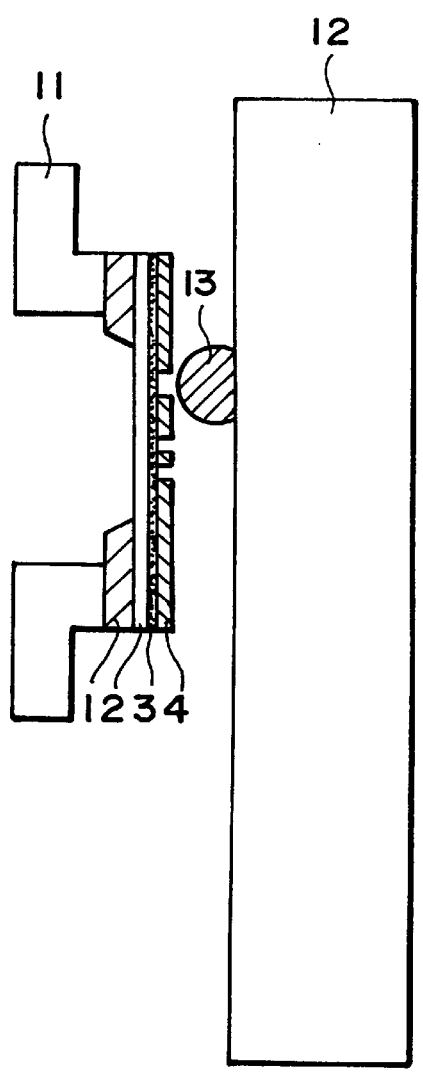
Figure 33:
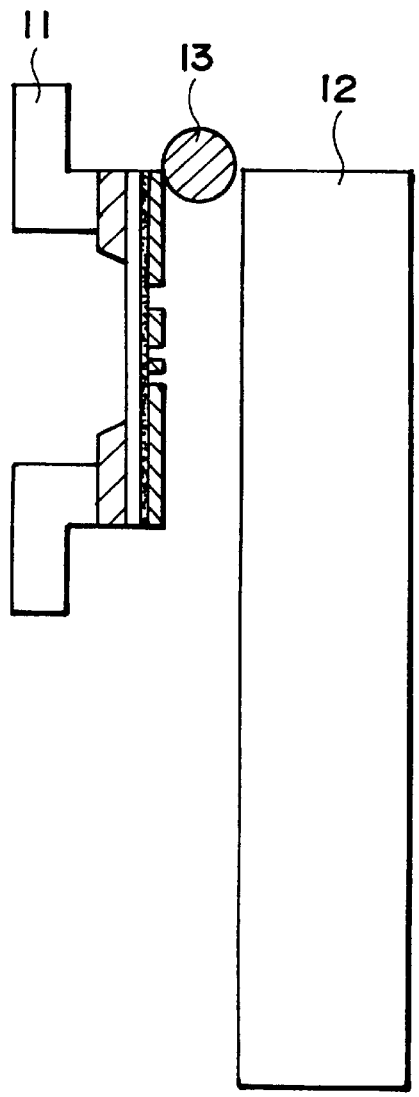

Subsequently, as shown in FIG. 16, the central portion (opening) 5 of the Si wafer is back etched from the side remote from the pattern, and then, as shown in FIG. 17, the mask is mounted on a frame 6. Here, the portion used for the mask handling is the portion 7 where the absorptive material 4 and the SiC film 2 at the peripheral portion have been removed. With this procedure, an X-ray mask of the present invention shown in FIG. 17 (like FIG. 1) is accomplished.

In this embodiment, for attaining a higher precision in the X-ray mask, as shown in FIG. 18, the substrate 1 may be first mounted on the frame 6 and, thereafter, as shown in FIG. 19, it may be back etched to form the opening 5. Then, an electron beam pattern drawing process may be performed to it. This is similar to the example of conventional mask manufacturing method shown in FIGS. 28 and 29.

The mask manufacture according to this embodiment involves the processes such as described above, by which an X-ray mask wherein control is made up to the peripheral portion can be accomplished. Also, this enables distinction of a dust particle adhered to the X-ray mask.

Particularly, in this embodiment, only the peripheral portion of the X-ray transmission film such as a SiC film or ITO film, for example, and of the X-ray absorptive material such as $Ta_4B$, for example, is removed. At such portion (defining an even step-like structure) (Si) the mask can be grasped and conveyed. This effectively prevents damage of the SiC film or ITO film or the absorbing material such as $Ta_4B$. Therefore, even if a currently available wafer dust particle inspection machine is used, erroneous detection of a large dust particle can be avoided.

Next, other embodiments of the X-ray mask of the present invention will be described.

In the first embodiment, exposure and etching processes are used to remove the X-ray absorptive material 4, the ITO film 3 and the SiC film 2 at the peripheral portion of the X-ray mask. However, the present invention is not limited to this procedure.

An example is that a resist may be applied to a substrate 1 (FIG. 12) having a SiC film 2 and, thereafter, while rotating the wafer, a chemical solvent may be sprayed to the bottom face of the wafer, to thereby remove a resist material adhered to the side face or bottom face (this process is called a side rinse or back rinse). By changing the condition such as the amount of sprayed chemical solvent, for example, a resist material at the top of the SiC film 2 can also be removed.

With this procedure, without the exposure and development processes described with reference to FIG. 13, the resist at the peripheral portion is removed such that an even step-like structure is defined there. Thus, the state such as shown in FIG. 13 is accomplished. The procedure following FIG. 13 may be the same as having been described above, by which an X-ray mask structure of the present invention can be produced.

What is important in the present invention is that the step-like structure at the peripheral portion of a mask is even such that an even signal output can be produced in the dust particle inspection, for discrimination of the step.

As an alternative, as shown in FIGS. 3, 4, 5 and 6, a masking member 9 may be directly contacted to a Si wafer surface 1 and, while masking it, a SiC film 2 and a ITO film 3 as well as an absorptive material 4 may be formed thereon. Even with this procedure, the X-ray mask can be provided with an even step-like structure at the peripheral portion thereof.

In that occasion, although the step-like structure is not vertical, since it is even, a constant signal output will be produced from a wafer dust particle inspection machine, as long as no dust particle is adhered there. Thus, it can be distinguished from a dust particle.

Further, the present invention is applicable to an X-ray mask structure (FIG. 7) as has been proposed by the same assignee of the subject application, in Japanese Laid-Open Patent Application, Laid-Open No. 181908/1990, and substantially the same advantageous results are attainable thereby.

Figure 7:
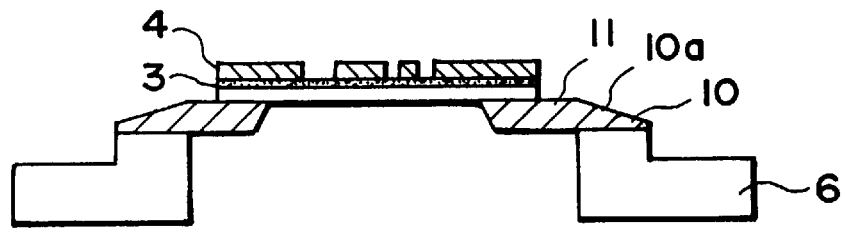
FIG. 7 is a schematic view of an X-ray mask structure wherein the present invention is applied to a mask having a silicon wafer substrate with a slant face formed at its peripheral portion, as already proposed by the assignee of the subject application.

As shown in FIG. 7, a holding frame 10 for a SiC membrane 11 comprises a Si wafer, and it has a slant surface formed at the peripheral portion 10a thereof. Thus, the structure is that the SiC membrane 11 is not produced on the whole surface of the Si wafer 10.

The SiC film 11 can be formed only in a limited region by using a vapor deposition cover equivalent to the film forming area. In this method, the distance between the SiC film surface 11 and the deposition cover is longer as compared with that in the method described hereinbefore and, also, the relative relation between them may be tilted. Thus, there are cases wherein uniformness of the step-like structure at the peripheral portion is dispersed.

In consideration of it, as described hereinbefore, exposure and etching processes or a masking process of direct contact may be used to provide an even step-like structure at the peripheral portion.

It is to be noted that the X-ray mask of the present invention is not limited to the mask structures described above. For example, a case has already been described with reference to FIG. 11 wherein the ITO film 3 and $SiO_2$ film 2 are formed on the substrate 1. This is to provide an etching stopper function to the etching process for the absorptive material 4. Also, in a system wherein wafer alignment is to be performed through an X-ray mask, an anti-reflection film or a transmission enhancing film (a film not having a complete anti-reflection function but having a function for increasing the transmission factor) can be provided by the SiC film 2 and the ITO film 3.

If, however, with the selection of the material for the X-ray absorptive member 4, it becomes unnecessary to provide such ITO film or $SiO_2$ film, then, the present invention can be accomplished by defining an even step-like structure at the peripheral portion by using the X-ray absorptive material 4 and the SiC film 2.

Figure 36:
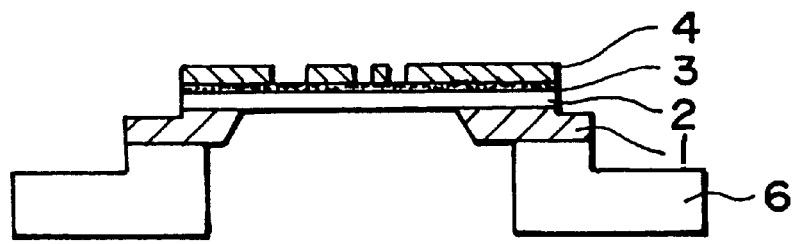
FIG. 36 is a schematic view of a mask structure wherein a peripheral portion thereof is cut together with a portion of a Si material.

Further, since what is required is to define an even step-like structure by the X-ray absorptive material 4 and the SiC film 2, as shown in FIG. 36, when the X-ray absorptive material 4 and the SiC film 2 are removed, the Si member 1 may be cut together with them. As long as an even step-like structure is defined thereby, the same advantageous results are attainable.

Figure 35:
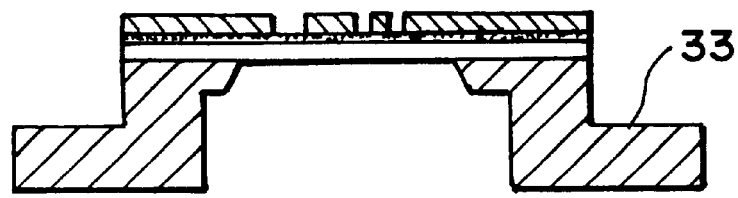
FIG. 35 is a schematic view of a mask structure wherein a mask and a frame are formed as a unit.
Figure 37:
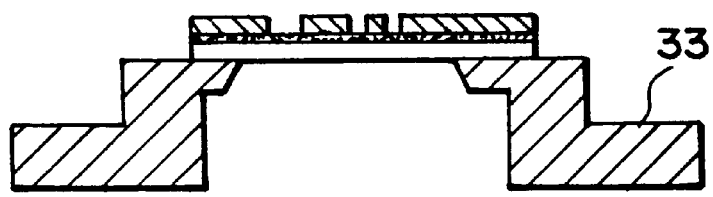
FIG. 37 is a schematic view of a mask structure wherein the present invention is applied to a mask having a mask and a frame formed integrally.

Furthermore, in a case of an integral-frame type X-ray mask wherein a substrate 1 and a frame 6 are formed as a unit (FIG. 35), as shown in FIG. 37, a portion of the substrate 33 may be formed into an even step-like structure. Substantially the same advantageous results as has been described above are attainable with this mask structure.

Nest, an embodiment of a dust particle inspection apparatus according to the present invention will be described.

Figure 41:
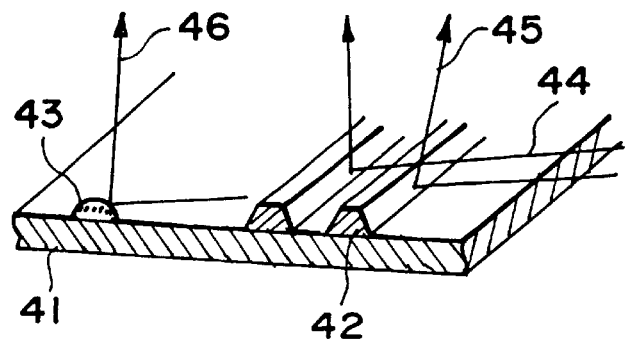
FIGS. 41–43 are schematic views, respectively, for explaining a dust particle inspection apparatus according to the present invention.

Referring to FIG. 41, if illumination light 44 is just projected onto the surface of a wafer 41 at an oblique angle 0, scattered light 43 and scattered light 44 are simultaneously produced from a pattern 42 and a dust particle 43. Therefore, the pattern 42 and the dust particle 43 can not be distinguished from each other. In consideration of it, polarized laser light is used as the illumination light 44 to enable detection of only the dust particle 43.

Figure 42:
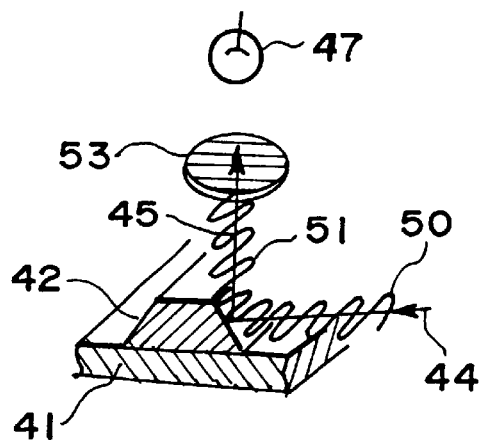

More specifically, as shown in FIG. 42, S-polarized laser light 44 is projected on a pattern 42 formed on a wafer 41. Here, where the electric vector 50 of the laser light 44 is parallel to the wafer surface, it is called as S-polarized laser illumination. Generally, when observed microscopically, the surface irregularities of the pattern 42 are sufficiently small as compared with the wavelength of the illumination light, and thus the surface can be regarded as being smooth, optically. Therefore, in reflection light 45 produced from the surface, the S-polarization component 51 can be well maintained.

Therefore, once an analyzer 53 for S-polarization interception is inserted into the light path of the reflection light 45, the reflection light 45 can be blocked and it does not reach a photoelectric converting element 47.

Figure 43:
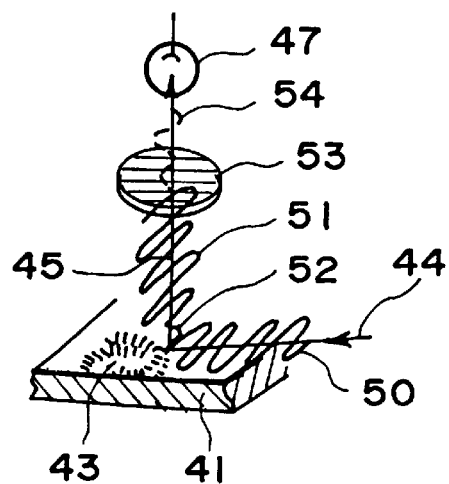

On the other hand, as shown in FIG. 43, the scattered light 46 from the dust particle 43 contains a P-polarized component 52 in addition to the S-polarized component. This is because the surface of the particle 43 is very rough so that the polarization is dissolved thereby and, as a result, the P-polarized component 52 is produced. Thus, by detecting the P-polarized component 52 passed through the analyzer 53 by using the photoelectric converting element 47, detection of the dust particle 43 is enabled.

Here, as regards reflection light from the pattern 42, where the longitudinal direction of the pattern 42 has a right angle with respect to the laser light 44 as shown in FIG. 41, the reflection light 45 is completely blocked by the analyzer 53. If the angle differs from the right angle, the light is not completely blocked. Details of this are discussed in "Journal of Measurement Automatic Control Association", Vol.17, No.2, pp232–242, 1981. According to this paper, only the reflection light from the pattern which is in a range of ±30 deg. from the right angle can enter an objective lens disposed above the wafer. Therefore, the reflection light 45 from the pattern inside this range is not completely blocked by the analyzer 53. Since, however, the intensity of such light is sufficiently small as can be distinguished from the scattered light from a dust particle of 2–3 micron, practically there is no problem.

FIG. 38 is a schematic view of a main portion of an embodiment of a semiconductor device manufacturing exposure apparatus, using an X-ray mask of the present invention.

Denoted in FIG. 38 at 139 is an X-ray beam which comprises a substantially parallel light and irradiates the surface of a mask (X-ray mask) 134. Denoted at 135 is a wafer having a surface coated with an X-ray lithography resist, for example. Denoted at 133 is a mask frame, and denoted at 134 is a mask membrane (mask). A circuit pattern is patterned on this surface by using an X-ray absorptive material.

Denoted at 232 is a mask supporting member, and denoted at 136 is a wafer fixing member such as a wafer chuck, for example. Denoted at 137 is a Z-axis stage which is made tiltable. Denoted at 138 is an X-axis stage, and denoted at 144 is a Y-axis stage.

An alignment detection functioning unit (position detecting unit) for the mask 134 and the wafer 135 is accommodated in casings 130a and 130b. With this unit, a gap between the mask 134 and the wafer 135 as well as positional deviation information in regard to directions along the X-Y plane can be detected.

Although there are two alignment detection functioning units 130a and 130b illustrated, practically, there are two additional alignment detection functioning units, so as to meet all the four sides of a rectangular IC circuit pattern area on the mask 134.

Each of the casings 130a and 130b accommodates therein optical systems and detection systems. Denoted at 146a and 146b are alignment detection lights from these alignment systems.

Signals produced by these alignment detection functioning units are processed by processing means 140, whereby a deviation along the X-Y plane as well as the gap value are detected. After discriminating the result, if the deviation is not within a predetermined range, driving systems 142 and 141 of the X and Y stages are actuated to reduce the deviation to a predetermined mask-to-wafer deviation. Also, the mask 134 is moved by a driving system 147 for the mask supporting member or, alternatively, the wafer 135 is moved, by an amount for correcting an alignment error due to the influence of an exposure distortion. Thereafter, the X-ray exposure beam 139 is projected to the mask 134. Before completion of the alignment operation, the X-ray beam is blocked by using an X-ray blocking member (not shown).

The structure being illustrated in the drawing is an example of an X-ray source and X-ray exposure apparatus.

Next, an embodiment of a semiconductor device manufacturing method which uses an exposure apparatus described above, will be explained.

Figure 39:
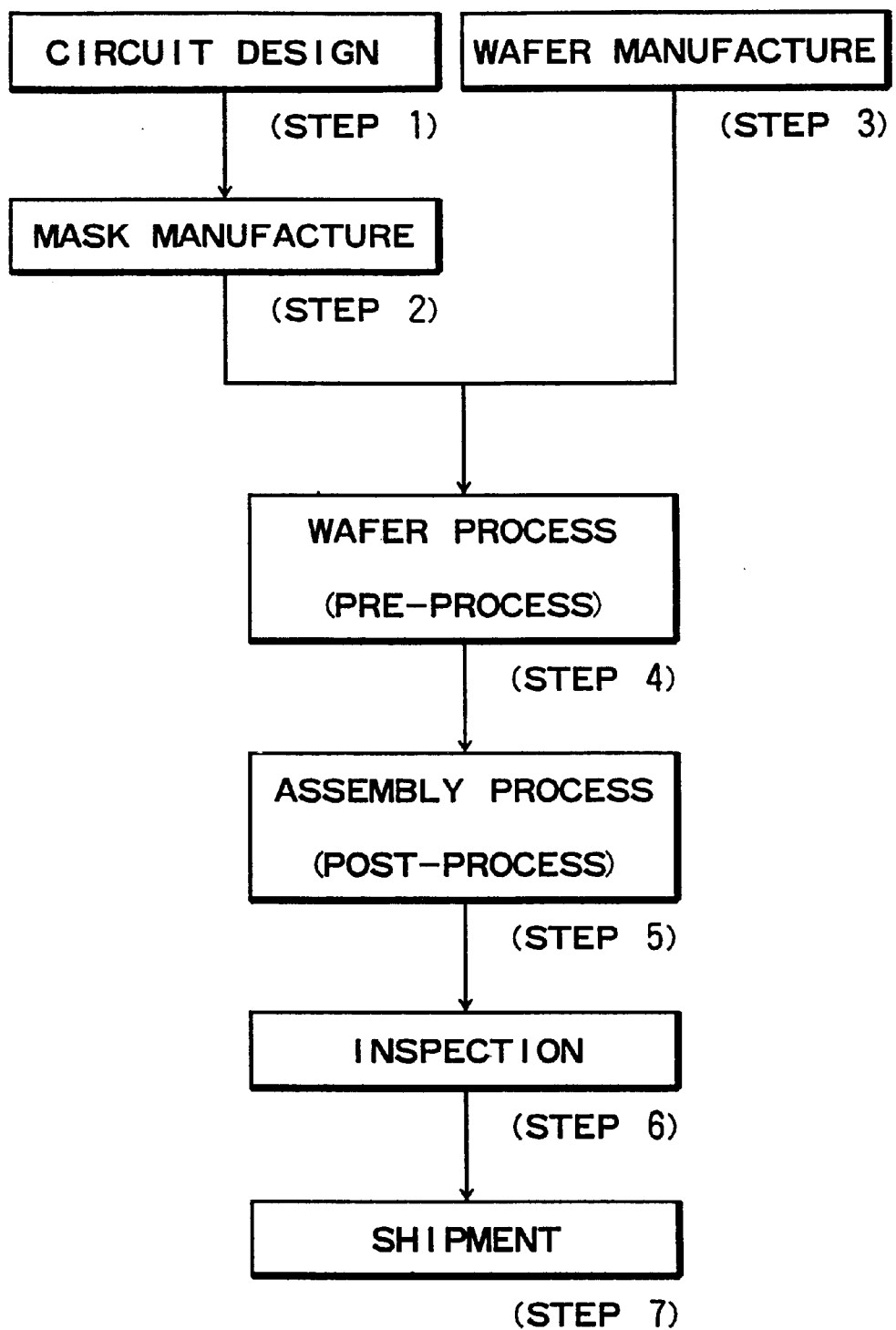
FIG. 39 is a flow chart of semiconductor device manufacturing processes.

FIG. 39 is a flow chart of procedure for manufacture of microdevices such as semiconductor chips (e.g. ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 40:
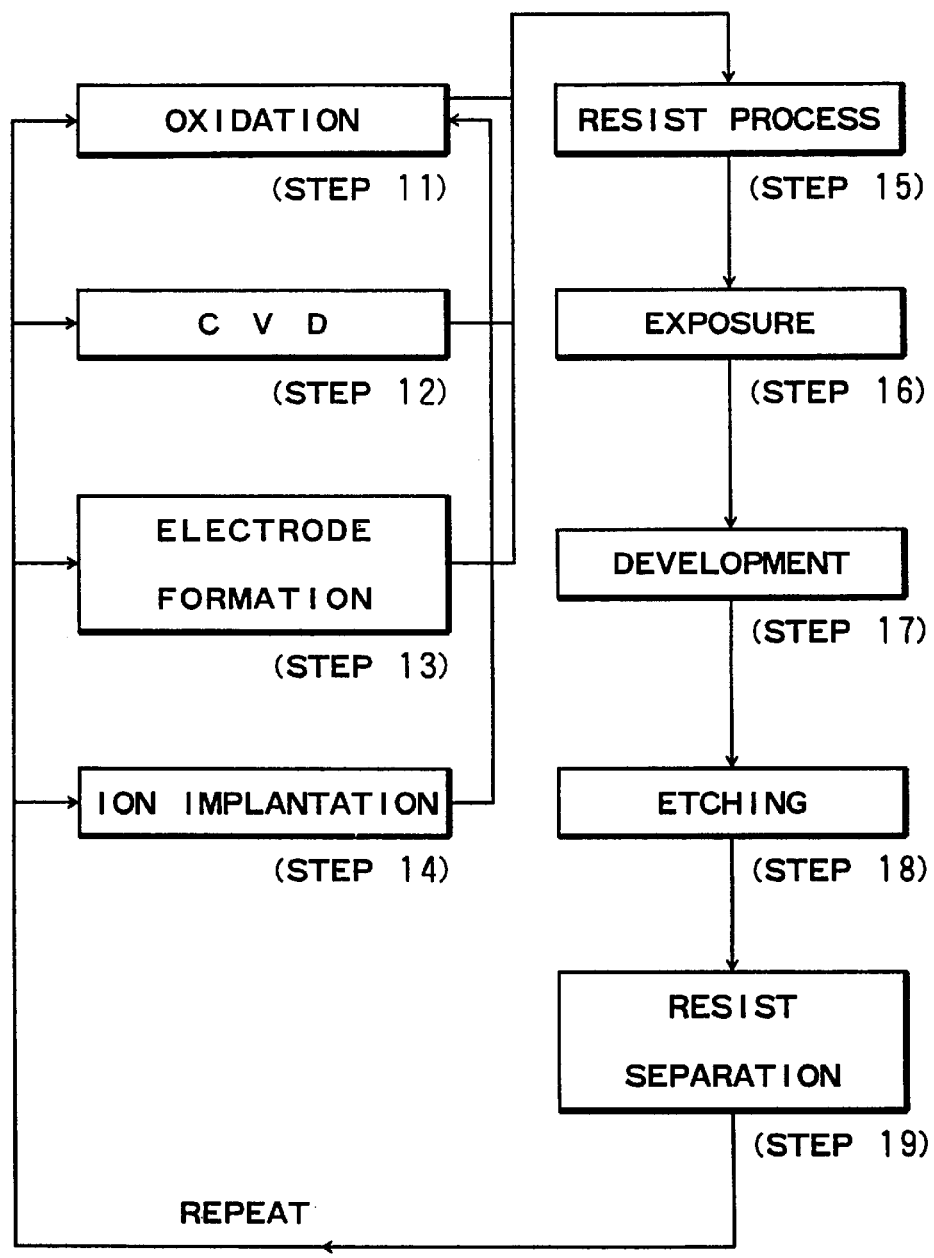
FIG. 40 is a flow chart for explaining details of a wafer process including in the procedure of FIG. 39.

FIG. 40 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the present invention, there is provided an X-ray mask as well as a device manufacturing method and an exposure method, by which a dust particle having a potential of mask breakage and a dust particle not having such potential can be discriminated and detected separately, such that large integration devices can be produced relatively easily.

Further, in accordance with the present invention, an even step-like structure is provided at a peripheral portion of an X-ray mask. This enables production of an even signal output in the dust particle inspection, to enable exact detection of a large dust particle actually present there. Thus, this effectively prevents breakage of the mask by a dust particle, caught between the mask and the wafer and having a size larger than the exposure gap, without erroneous detection.

Furthermore, in accordance with an X-ray mask manufacturing method of the present invention, the material at the peripheral portion can be removed while an X-ray transmission film is being supported by a supporting frame. This facilitates formation of a step with uniform structure, at the peripheral portion.

While the invention has been described with reference to the structures disclosed herein, it is not confined to the details set forth and this application is intended to cover such modifications or changes as may come within the purposes of the improvements or the scope of the following claims.

What is claimed is:

1. A dust particle inspection method for use with an X-ray mask for use in a proximity exposure apparatus, wherein said X-ray mask comprises an X-ray transmission film having a layered X-ray absorptive material formed thereon and a holding member for holding said X-ray transmission film, wherein a peripheral portion of the X-ray transmission film and the X-ray absorptive material is formed into a step-like shape with respect to the holding member wherein the method comprises:

when the dust particle inspection is made with respect to the peripheral portion of the X-ray transmission film and the X-ray absorptive material, an even signal output is produced therefrom such that the peripheral portion of the X-ray transmission film and the X-ray absorptive material can be detected to enable dust particle control at the peripheral portion.

2. A method according to claim 1, wherein the step-like shape of the peripheral portion of the X-ray transmission film and the X-ray absorptive material is defined by removing, by etching, a substance at the peripheral portion of the X-ray transmission film and the X-ray absorptive material.

* * * * *

UNITED STATES PATENT AND TRADEMARK OFFICE
CERTIFICATE OF CORRECTION

PATENT NO. : 6,770,408 B2
DATED : August 20, 2002
INVENTOR(S) : Hideki Ina et al.

It is certified that error appears in the above-identified patent and that said Letters Patent is hereby corrected as shown below:

Column 11,
Line 34, "Nest," should read -- Next, --.
Line 38, "0," should read -- ø, --.

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

PATENT NO.   : 6,770,408 B2
DATED        : August 3, 2004
INVENTOR(S)  : Hideki Ina et al.

It is certified that error appears in the above-identified patent and that said Letters Patent is hereby corrected as shown below:

Title page,
Item [73], Assignee, insert -- Mitsubishi Denki Kabushiki Kaisha, Tokyo (JP) --.

Signed and Sealed this

Sixth Day of September, 2005

JON W. DUDAS
*Director of the United States Patent and Trademark Office*